United States Patent
Eichler et al.

(10) Patent No.: US 7,822,089 B2
(45) Date of Patent: *Oct. 26, 2010

(54) SEMICONDUCTOR LAYER STRUCTURE WITH SUPERLATTICE

(75) Inventors: Christoph Eichler, Tegernheim (DE); Alfred Lell, Maxhutte-Haidhof (DE)

(73) Assignee: Osram Opto Semiconductors GmbH, Regensburg (DE)

(*) Notice: Subject to any disclaimer, the term of this patent is extended or adjusted under 35 U.S.C. 154(b) by 214 days.

This patent is subject to a terminal disclaimer.

(21) Appl. No.: 11/780,512

(22) Filed: Jul. 20, 2007

(65) Prior Publication Data

US 2008/0025360 A1    Jan. 31, 2008

(30) Foreign Application Priority Data

Jul. 27, 2006 (DE) .................. 10 2006 034 821
Sep. 29, 2006 (DE) .................. 10 2006 046 227

(51) Int. Cl.
*H01S 5/00* (2006.01)
*H01L 33/00* (2010.01)

(52) U.S. Cl. ..................... 372/45.012; 372/43.01; 257/21; 257/103

(58) Field of Classification Search ............. 372/43.01, 372/45.012
See application file for complete search history.

(56) References Cited

U.S. PATENT DOCUMENTS

| | | | |
|---|---|---|---|
| 4,839,899 A | 6/1989 | Burnham et al. | |
| 4,882,734 A | 11/1989 | Scifres et al. | |
| 4,984,242 A | 1/1991 | Scifres et al. | |
| 5,027,164 A | 6/1991 | Awano | |
| 5,128,728 A | 7/1992 | Liu | |
| 5,198,682 A * | 3/1993 | Wu et al. | 257/21 |
| 5,319,657 A * | 6/1994 | Otsuka et al. | 372/43.01 |

(Continued)

FOREIGN PATENT DOCUMENTS

DE    102 13 395    10/2002

(Continued)

OTHER PUBLICATIONS

T. Asano et al., "High-power 400-nm-band AlGaInN-based laser diodes with low aspect ratio", *Applied Physics Letters*, vol. 80, No. 19, pp. 3497-3499 (May 13, 2002).

(Continued)

*Primary Examiner*—Minsun Harvey
*Assistant Examiner*—Phillip Nguyen
(74) *Attorney, Agent, or Firm*—Fish & Richardson P.C.

(57) ABSTRACT

The semiconductor layer structure comprises a superlattice (9) composed of alternately stacked layers (9a, 9b) of III-V semiconductor compounds of a first composition (a) and at least one second composition (b). The layers (9a, 9b) of the superlattice (9) contain dopants in predetermined concentrations, with regard to which the concentrations of the dopants are different at least two layers of a same composition in the superlattice (9), the concentration of the dopants is graded within at least one layer (9a, 9b) of the superlattice (9), and the superlattice (9) comprises layers that are doped with different dopants or comprise at least one layer (9a, 9b) that is undoped. The electrical and optical properties of the superlattice (9) can be adapted to given requirements in the best possible manner in this way.

19 Claims, 4 Drawing Sheets

U.S. PATENT DOCUMENTS

| | | | |
|---|---|---|---|
| 5,395,793 | A | 3/1995 | Charbonneau et al. |
| 5,497,012 | A * | 3/1996 | Moll ............................ 257/183 |
| 5,570,386 | A * | 10/1996 | Capasso et al. ............ 372/46.01 |
| 5,588,015 | A * | 12/1996 | Yang ........................ 372/45.012 |
| 5,936,989 | A * | 8/1999 | Capasso et al. .......... 372/45.012 |
| 6,046,464 | A | 4/2000 | Schetzina |
| 6,172,382 | B1 * | 1/2001 | Nagahama et al. ............. 257/94 |
| 6,175,123 | B1 | 1/2001 | Kano |
| 6,455,870 | B1 * | 9/2002 | Wang et al. ..................... 257/12 |
| 6,489,636 | B1 | 12/2002 | Goetz et al. |
| 6,541,798 | B2 | 4/2003 | Koike et al. |
| 6,617,061 | B2 | 9/2003 | Koike et al. |
| 6,649,942 | B2 * | 11/2003 | Hata et al. .................... 257/103 |
| 6,849,864 | B2 * | 2/2005 | Nagahama et al. ............. 257/22 |
| 6,849,881 | B1 | 2/2005 | Harle et al. |
| 7,106,090 | B2 | 9/2006 | Harle et al. |
| 7,556,974 | B2 | 7/2009 | Harlet et al. |
| 7,609,737 | B2 | 10/2009 | Matsumura et al. |
| 2001/0028668 | A1 | 10/2001 | Fukunaga et al. |
| 2002/0008245 | A1 * | 1/2002 | Goetz et al. .................... 257/87 |
| 2002/0190259 | A1 | 12/2002 | Goetz et al. |
| 2002/0190263 | A1 * | 12/2002 | Hata et al. .................... 257/103 |
| 2003/0010993 | A1 * | 1/2003 | Nakamura et al. ............. 257/99 |
| 2003/0042479 | A1 | 3/2003 | Tsuchiya |
| 2003/0118066 | A1 | 6/2003 | Bour et al. |
| 2003/0178633 | A1 | 9/2003 | Flynn et al. |
| 2003/0197188 | A1 | 10/2003 | Watatani et al. |
| 2003/0235224 | A1 | 12/2003 | Ohlander |
| 2004/0051107 | A1 | 3/2004 | Nagahama et al. |
| 2004/0208213 | A1 | 10/2004 | Lichtenstein et al. |
| 2005/0029506 | A1 | 2/2005 | Lee et al. |
| 2005/0045895 | A1 | 3/2005 | Emerson et al. |
| 2005/0051861 | A1 * | 3/2005 | Shi et al. ..................... 257/438 |
| 2005/0056824 | A1 * | 3/2005 | Bergmann et al. ............. 257/14 |
| 2005/0116216 | A1 | 6/2005 | Harle et al. |
| 2005/0142682 | A1 * | 6/2005 | Ishibashi et al. ............... 438/45 |
| 2005/0151255 | A1 * | 7/2005 | Ando et al. ................... 257/750 |
| 2005/0213627 | A1 * | 9/2005 | Masselink et al. ....... 372/45.011 |
| 2006/0011938 | A1 * | 1/2006 | Debray et al. ................ 257/104 |
| 2006/0256825 | A1 * | 11/2006 | Matsumura et al. ....... 372/43.01 |
| 2008/0025360 | A1 | 1/2008 | Eichler et al. |
| 2008/0049801 | A1 | 2/2008 | Eichler et al. |
| 2008/0054247 | A1 | 3/2008 | Eichler et al. |
| 2008/0054252 | A1 | 3/2008 | Eichler et al. |

FOREIGN PATENT DOCUMENTS

| | | |
|---|---|---|
| EP | 0 358 842 | 3/1990 |
| EP | 0 378 919 | 7/1990 |
| EP | 0874403 | 10/1998 |
| EP | 0 881 666 | 12/1998 |
| EP | 1 018 770 | 7/2000 |
| EP | 1 215 781 | 6/2002 |
| EP | 1 220 304 | 7/2002 |
| EP | 1 670 106 | 6/2006 |
| EP | 1 883 140 | 1/2008 |
| EP | 1 883 141 | 1/2008 |
| GB | 2 396 054 | 6/2004 |
| JP | 60-145686 | 8/1985 |
| JP | 10-22524 | 1/1998 |
| JP | 11-251684 | 9/1999 |
| JP | 2000-91708 | 3/2000 |
| JP | 2000-244070 | 9/2000 |
| JP | 2008-034850 | 2/2008 |
| JP | 2008-034851 | 2/2008 |
| JP | 2008-034852 | 2/2008 |
| WO | WO 00/58999 | 10/2000 |
| WO | WO 2004/084366 | 10/2004 |
| WO | WO 2006/068376 | 6/2006 |

OTHER PUBLICATIONS

M.Z. Kauser et al., "Enhanced vertical transport in p-type AlGaN/GaN superlattices", *Applied Physics Letters*, vol. 85, No. 22, pp. 5275-5277 (Nov. 29, 2004).

M.Z. Kauser et al., "Optimization of conductivity in p-type GaN/InGaN-graded superlattices", *Journal of Applied Physics*, vol. 97, pp. 083715-1-083715-5 (2005).

Peter Kozodoy et al., "Enhanced Mg doping efficiency in $Al_{0.2}Ga_{0.8}N$/GaN superlattices", *Applied Physics Letters*, vol. 74, No. 24, pp. 3681-3683 (Jun. 14, 1999).

Peter Kozodoy et al., "Polarization-enhanced Mg doping of AlGaN/GaN superlattices", *Applied Physics Letters*, vol. 75, No. 16, pp. 2444-2446 (Oct. 18, 1999).

Kazuhide Kumakura et al., "Increased Electrical Activity of Mg-Acceptors in $Al_xGa_{1-x}N$/GaN Superlattices", *Jpn. J. Appl. Phys.*, vol. 38, pp. L1012-L1014 (1999).

M. Kuramoto et al., "Reduction of Internal Loss and Threshold Current in a Laser Diode with a Ridge by Selective Re-Growth (RiS-LD)", *Phys. stat. sol.*, vol. 192, No. 2, pp. 329-334 (2002).

K.A. Mikhoyan et al., "Formation of a quasi-two-dimensional electron gas in $GaN/Al_xGa_{1-x}N$ heterostructures with diffuse interfaces", *Journal of Applied Physics*, vol. 95, No. 4, pp. 1843-1848 (Feb. 15, 2004).

Guido Steude et al., "Strain Modification of GaN in AlGaN/GaN Epitaxial Films", *Jpn. J. Appl. Phys.*, vol. 38, pp. L498-L500 (1999).

European Search Report for Application Serial No. 07013822.7-2222 dated Oct. 24, 2007.

S. Nakamura et al., "Present status of InaN/GaN/AlGaN-based laser diodes", *Journal of Crystal Growth*, North Holland Publishing Amsterdam, NL, vol. 189-190 (Jun. 15, 1998).

Ting Gang Zhu et al., "AiGaN-GaN UV Light-Emitting Diodes Grown on SIC by Metal-Organic Chemical Vapor Deposition", *IEEE Journal of Selected Topics in Quantum Electronics*, IEEE Service Center, Piscataway, NJ, vol. 8, No. 2 (Mar. 2002).

European Search Report for Application No. 07013821.9-2222 dated Nov. 12, 2007.

EP search report, dated Oct. 21, 2008.

* cited by examiner

SEMICONDUCTOR LAYER STRUCTURE WITH SUPERLATTICE

This patent application claims the priority of German Patent Applications 10 2006 034 821.4 and 10 2006 046 227.0, whose disclosure content is hereby incorporated by reference.

The invention relates to a semiconductor layer structure comprising a superlattice composed of alternately stacked layers of III-V semiconductor compounds of a first and at least one second composition. The invention further relates to an optoelectronic component comprising such a semiconductor layer structure.

Superlattices containing alternately stacked layers of different composition have different electrical, optical and epitaxial properties from a layer of the same thickness that is composed of just one material of one composition. In particular, with a suitable composition and doping, a superlattice composed of alternately stacked p-doped gallium nitride (GaN) and p-doped aluminum gallium nitride (AlGaN) layers may have a higher conductivity than a p-doped pure GaN or AlGaN layer of the same thickness. Due to these properties, superlattices have found multifarious applications in electronic and optoelectronic components.

It is an object of the invention to create a semiconductor layer structure with superlattice of the initially cited kind that has improved electrical and optical properties. It is a further object of the invention to specify an optoelectronic component having such a semiconductor layer structure.

This object is achieved, in accordance with Claim 1, by means of a semiconductor layer structure of the initially cited kind wherein the layers of the superlattice contain dopants in predetermined concentrations, the concentrations of the dopants are different in at least two layers of a same composition in the superlattice, and the concentration of the dopants is graded within at least one layer of the superlattice, and wherein the superlattice comprises layers that are doped with different dopants.

This object is further achieved, in accordance with Claim 3, by means of a semiconductor layer structure of the initially cited kind wherein the layers of the superlattice contain dopants in predetermined concentrations, the concentrations of the dopants are different in at least two layers of a same composition in the superlattice, and the concentration of the dopants is graded within at least one layer of the superlattice, and wherein the superlattice comprises at least one layer that is undoped.

The electrical, optical and epitaxial properties of the superlattice can be adapted to given requirements in the best possible manner in this way. The requirements placed on the superlattice frequently are not the same over its entire thickness, for example because physical variables, such as electrical or optical field strength, that influence those requirements also are not constant over the thickness of the superlattice. This fact can be accommodated through the use of a non-constant degree of doping, a graded concentration of the dopant within at least one layer, and different dopants in the layers of the superlattice, or at least one layer that is undoped.

The term "superlattice" basically denotes a structure that exhibits a periodicity in which the period length is greater than the lattice constants of the materials used. In the context of the application, the term "superlattice" is applied to a sequence of alternately stacked layers in which a layer sequence that includes at least two layers of different types repeats in a direction perpendicular to the interfaces between the layers, i.e., for example, in the growth direction of the layers. "Alternately" is to be understood here as meaning that two or more layers succeed one another by turns. A type can be represented by more than one layer in such a repeating layer sequence. Examples of such superlattices are provided by the following layer sequences: "ab | ab | ab | . . . ", "abc | abc | abc | . . . ", abcb | abcb | . . . " and "abababc | abababc | . . . ", where a, b and c each represent layers of a respective type and the repeating layer sequence is indicated by the separator "|".

In the context of the application, the composition of a layer is defined by elements contained in the layer and by its nominal stoichiometry (i.e., the stoichiometry within the accuracy limits of composition monitoring during or after the growth process), dopants and impurities excluded. The stoichiometry is given by the content (percentage) of individual elements in the layer. In the context of the invention, there is no limit on the number of elements in a layer. The layers of the superlattice can, for example, be elementary, i.e. composed of only one element, or they can be binary, ternary, quaternary, etc.

In a preferred configuration, the superlattice comprises alternately stacked layers of III-V compound semiconductors of a first and at least one second composition, wherein the layers contain dopants in predetermined concentrations, the concentrations of the dopants in at least two layers of a same composition are different, the concentration of the dopants within at least one layer of the superlattice is graded and the superlattice comprises layers that are doped with different dopants, and wherein at least one layer is undoped.

According to advantageous configurations of the semiconductor layer structure, the superlattice comprises alternately stacked $In_xAl_yGa_{1-x-y}N$ and $In_wAl_zGa_{1-w-z}N$ layers, where $0 \leq x,y,w,z \leq 1$ and $x+y \leq 1$ and $w+z \leq 1$, or alternately stacked $In_xAl_yGa_{1-x-y}P$ and $In_wAl_zGa_{1-w-z}P$ layers, where $0 \leq x,y,w, z \leq 1$ and $x+y \leq 1$ and $w+z \leq 1$, or alternately stacked $In_xAl_yGa_{1-x-y}As$ and $In_wAl_zGa_{1-w-z}As$ layers, where $0 \leq x,y,w,z \leq 1$ and $x+y \leq 1$ and $w+z \leq 1$. These material systems are very important technologically, for one thing, and for another, an advantageous increase in conductivity in terms of hole conduction can be observed in these systems with the use of a superlattice.

According to a further advantageous configuration of the semiconductor layer structure, the individual layers of the superlattice are each assigned a vertical position within the semiconductor layer structure and the concentration of the dopants in a layer depends in a predetermined manner on the vertical position of that layer within the semiconductor layer structure. In this way, the superlattice and its properties can be adapted in the best possible manner to varying physical quantities within the semiconductor layer structure.

According to further advantageous configurations, the dependence of the concentration of the dopants on vertical position either is defined by a common function for all the layers or is defined by a first function for layers of the first composition and by at least one second function for layers of the at least one second composition. Particularly preferably, the first and/or the at least one second and/or the common function is a step function or a monotonously rising/falling function or a linear function or a polynomial function or a root function or an exponential function or a logarithmic function or a periodic function or a superposition of the aforesaid functions or contains fractions of one of these functions.

It is particularly preferred for the dopants to be magnesium (Mg) and/or silicon (Si).

The object is further achieved by means of an optoelectronic component comprising a semiconductor layer structure of the before-described kind. In an optoelectronic component, during operation a radiation field is generated whose field strength amplitude is usually highly nonuniform within the component. A semiconductor layer structure with a superlattice in which at least two layers of the same composition contain dopants in different concentrations can be adapted in terms of its electrical and optical properties in the best possible manner to the prevailing nonuniform field strength amplitude of the optical radiation field.

According to an advantageous configuration of the optoelectronic component, the latter comprises an optically active layer and the respective concentrations of dopants in layers of one or more compositions within the superlattice of the semiconductor layer structure increase with increasing distance from the optically active layer. Since, in an optoelectronic component comprising an optically active layer, the field strength amplitude of the radiation field usually decreases with increasing distance from the optically active layer and a high dopant concentration is typically associated with high optical absorption, optical losses can be reduced in this way.

According to further advantageous configurations, the optoelectronic component is a light-emitting diode or a laser diode.

Further advantageous configurations of the invention will become apparent from the exemplary embodiments described hereinafter in conjunction with the figures.

Therein.

Figure 1:
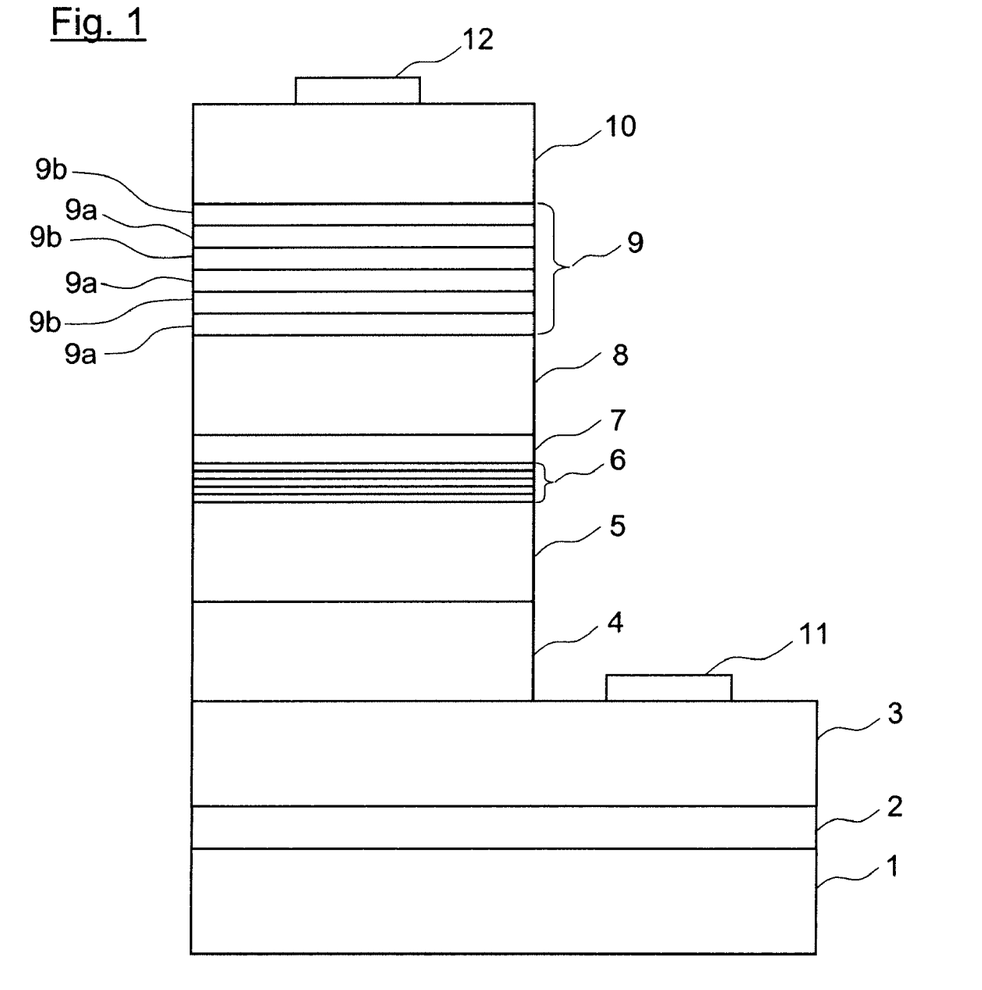
FIG. 1 is a cross-sectional drawing of an optoelectronic component comprising a semiconductor layer structure with superlattice and FIGS. 2-3 are schematic representations of the field strength amplitude and of the refractive index and dopant concentration within a superlattice in different exemplary embodiments of a semiconductor layer structure with superlattice.

FIG. 1 provides a schematic illustration in cross section of the layer sequence of a semiconductor layer structure of an optoelectronic component with a superlattice. Grown on a substrate 1 is a matching layer 2, followed by an n-doped contact layer 3. To simplify description, the type of doping used in the layers will be specified below by adding the letter n or p as a prefix, i.e., for example, n-contact layer 3.

Disposed on the n-contact layer 3 are an n-cladding layer 4 and an n-waveguide layer 5. Applied to these is an active layer 6, followed by a barrier layer 7 and a p-waveguide layer 8. This is followed by a p-cladding layer, which is implemented as a superlattice 9. The superlattice 9 contains the alternately stacked layers 9a of a first composition a, and 9b of a second composition b. Layers 9a, 9b of the same respective compositions a, b are also referred to collectively hereinafter by the term "layer set 9a, 9b."

Grown on the superlattice 9 is a p-contact layer 10. In the region on the right, the layer sequence is ablated by etching down to a surface of n-contact layer 3 facing away from the substrate, or masking was used to prevent this region from being built up in the first place. An n-contact 11 is applied to the exposed area of n-contact layer 3. A p-contact 12 is disposed on p-contact layer 10.

FIG. 1 is to be understood as a schematic drawing. In particular, the illustrated layer thicknesses are not true to scale.

The illustrated exemplary embodiment can be implemented, for example, on the basis of $In_xAl_yGa_{1-x-y}N$, $In_xAl_yGa_{1-x-y}As$, $In_xAl_yGa_{1-x-y}P$ or $In_xGa_{1-x}As_yN_{1-y}$ material systems in which $0 \leq x \leq 1$, $0 \leq y \leq 1$, $0 \leq x+y \leq 1$. The invention naturally is not limited to these material systems, but can also be constructed on the basis of other material systems, depending on the desired wavelength or other requirements.

The component illustrated in FIG. 1 represents a double heterostructure laser diode. Implementation with the $In_xAl_yGa_{1-x-y}N$ material system is described in more detail below by way of example. In such a case, sapphire can be used as the substrate 1 and n-doped GaN as the n-contact layer 3. Silicon (Si) is preferably used to n-dope the GaN layer. An aluminum nitride (AlN) layer is typically provided as a matching layer 2 between the sapphire substrate 1 and the GaN n-contact layer 3 to match the different lattice constants of this layer [sic].

Analogously, the p-contact layer 10 can be implemented in the form of a GaN layer p-doped with magnesium (Mg), in which case hole conduction induced by the magnesium impurities is activated in a known manner, e.g. by electron irradiation or heat treatment, after the growth of the layer. As the n- or p-contacts respectively 11 and 12, electrodes, made for example of aluminum or nickel, can be vapor-deposited on the corresponding n- or p-contact layers respectively 3 and 10. The exposure of the n-contact layer 3 that must be achieved for this purpose can be effected, for example, by means of a dry etch process performed in chlorine gas or by argon ion sputtering.

Alternatively, a conductive substrate such as, for example, gallium nitride (GaN) or silicon carbide (SiC) can be used instead of a nonconductive substrate 1. Under these circumstances, it may be possible to dispense with the n-contact layer 3 and, in some cases, e.g. if GaN is used, with the matching layer 2. The n-contact 11 can then be applied opposite the p-contact 12 on the side of the substrate facing away from the semiconductor layer structure, so that a vertically conductive semiconductor layer structure is formed.

Without limitation, FIG. 1 depicts an exemplary embodiment in which n-doped layers are applied to the substrate 1 first. An arrangement in which p-doped layers are arranged closer to the substrate 1 than the n-doped layers is also feasible. The two embodiments may have different properties in terms of charge carrier injection into the semiconductor layer structure. Either embodiment may prove advantageous in the individual case, depending on the desired properties.

The active layer 6 can be, for example, a single or multiple quantum layer structure, in which indium gallium nitride (InGaN) quantum layers are stacked alternately with AlGaN barrier layers.

In the context of the invention, the term "quantum layer" is to be understood as a layer dimensioned or structured such that a quantization of the charge carrier energy level that is essential for the production of radiation occurs, for example by confinement. In particular, the term "quantum layer" carries no implication or restriction as to the dimensionality of the quantization. The quantum layer can form a two-dimensional quantum well or contain structural elements of lower dimensionality, such as quantum wires or quantum dots or combinations of these structures.

In addition, it may also be contemplated to use a photoluminescence-active layer, e.g. a foreign-atom-doped InGaN layer, as active layer 6.

The layers surrounding the active layer 6 (n- and p-waveguide layers respectively 5 and 8, n-cladding layer 4, superlattice 9 as a p-cladding layer, and barrier layer 7) have a larger band gap than the active layer 6. This causes a concentration or confinement of charge carriers on the active layer 6. The number of layers provided for this purpose is not fixed at the number shown in the figure (i.e., five layers), but is in principle arbitrary.

Furthermore, the layers surrounding the active layer 6 form a waveguide for the radiation generated in the active layer 6. Good waveguiding properties are obtained if the refractive index decreases away from the active layer 6 in a direction perpendicular thereto. Since GaN has a higher refractive index than AlGaN, the n- and p-waveguide layers respectively 5 and 8 that are disposed closer to the active layer 6 are implemented as GaN layers in the exemplary embodiment, n-cladding layer 4 and superlattice 9, as a p-cladding layer, preferably contain aluminum.

On the side of active layer 6 facing toward the substrate 1 (i.e., the n-doped side), the waveguide layer 5 can therefore be implemented, for example, as an Si-doped GaN layer and the cladding layer 4, correspondingly, as an Si-doped AlGaN layer. On the side of active layer 6 facing away from the substrate 1 (i.e., the p-doped side), analogously, a magnesium (Mg) doped GaN layer can be used as waveguide layer 8. To prevent the direct recombination of electrons diffusing out of the active layer 6 into the waveguide layer 8 with the holes that are present there, barrier layer 7 is additionally provided between the two layers. This can be implemented in the form of an AlGaN layer, which is typically fashioned as much thinner than n- and p-waveguide layers respectively 5 and 8, n-cladding layer 4 or superlattice 9.

The p-side cladding layer is constituted by superlattice 9.

In the exemplary embodiment of FIG. 1, the superlattice 9 is formed by alternately arranged layers 9a of first composition a and layers 9b of second composition b. By way of example and for greater clarity of illustration, only three layers of each of the two different compositions a and b are illustrated in the figure. In actual reductions to practice of the invention, the superlattice usually has a larger number of layers, for example several tens of to a few hundred layers of each composition. Typical layer thicknesses for an individual layer of the superlattice 9 are in the range of a few nm to several tens of nm, e.g. between 2 nm and 50 nm and preferably between 3 nm and 10 nm. Layers of the same composition have nominally (i.e. within the precision of layer thickness control during or after the growth process) the same layer thickness. Nevertheless, the layers 9a of first composition a and the layers 9b of second composition b can differ in thickness from each other (asymmetrical superlattice) or be of the same thickness (symmetrical superlattice).

The superlattice 9 can not only be composed of layers having two different compositions a, b, as shown, but also of layers having three or more different compositions, for example by having a layer sequence be constituted by "abcdabcdabcd . . . " or "abcbabcb . . . ," where c and d are compositions that differ from each other and from the first and second compositions a and b. As stated above, in the context of the application, the composition of a layer is defined by elements contained in the layer and by its nominal stoichiometry (i.e., the stoichiometry within the accuracy of composition monitoring during or after the growth process), dopants and impurities excluded. Thus, in the sense of this definition, for example $Al_{0.1}Ga_{0.9}N$ layers and $Al_{0.2}Ga_{0.8}N$ layers have different compositions, while a GaN layer n-doped with Si and an undoped GaN layer are to be considered layers of the same composition. There is no limit on the number of elements in a layer. The layers of the superlattice 9 can, for example, be elementary, i.e. composed of only one element, or they can be binary, ternary, quaternary, etc.

In the GaN-based material system, the superlattice 9, as a p-cladding layer, can be composed for example of alternating Mg-doped GaN layers and Mg-doped AlGaN layers. Due to the high activation energy of the Mg doping atoms, the electrical conductivity of p-doped layers is low. In addition, AlGaN has a larger band gap than GaN and, due to its lower doping efficiency, a lower conductivity. The doping efficiency specifies the concentration in which dopants are actually incorporated by the material and what fraction of the incorporated dopant atoms are theoretically (i.e. ignoring temperature-induced filling effects) actually able to contribute to conductivity. Doping efficiency depends, among other things, on which lattice sites or interlattice sites the doping atoms occupy.

Through the use of more highly and more efficiently dopable, and therefore more conductive, GaN layers, the superlattice 9 can, with an effectively equal refractive index, have a higher conductivity than a p-doped pure AlGaN cladding layer. An effectively equal refractive index can be obtained by having the aluminum content of the AlGaN layers used in the superlattice 9 be higher than that of the AlGaN cladding layer.

Instead of a GaN/AlGaN superlattice 9, a superlattice 9 is also conceivable in which $Al_xGa_{1-x}N/Al_yGa_{1-y}N$ layers, where $0 \leq x, y \leq 1$ and $x \neq y$, are alternately stacked. It is further conceivable to use a superlattice for the n-doped AlGaN cladding layer 4. Given the generally higher conductivity of n-doped layers, the advantage in this case does not lie primarily in higher vertical conductivity. However, advantages are to be gained from a potential reduction of the strains induced in the active layer 6. A further advantage, which is relevant particularly in the case of lateral current injection, derives from the increased lateral electrical conductivity of a superlattice.

Superlattices in which all layers 9a of composition a and all layers 9b of second composition b have the same respective doping, i.e. contain the same respective dopants in the same respective concentrations, are known, for example, from EP 0881666 B 1 or from the paper by P. Kozodoy et al. published in Applied Physics Letters 1999, Vol. 74, No. 24, p. 3681.

According to the invention, however, the concentration of the dopants is different in at least two layers of the same composition. Hence, according to the invention there is at least one layer out of at least one set of layers 9a and/or 9b that is doped differently from the remaining layers of the layer set.

Furthermore, according to the invention the concentration of the dopants is graded in at least one layer of the superlattice 9. Hence, according to the invention there is at least one layer out of at least one set of layers 9a and/or 9b that is graded.

Further, according to the invention the superlattice 9 comprises layers 9a and/or 9b that are doped with different dopants. Hence, according to the invention there is at least one layer out of at least one set of layers 9a and/or 9b that is doped with a different dopant from the other layers.

Described hereinafter in conjunction with FIGS. 2 and 3 are semiconductor layer structures in which the degree of doping of layers of the same composition (layer set) varies within a superlattice. The layer sequence of the exemplary embodiments illustrated hereinafter is basically the same as in the example of FIG. 1, with the exception of the n-contact layer 3, the matching layer 2 and the substrate 1, which are not reproduced in the graphs of FIGS. 2 and 3.

The illustrations of FIGS. 2 and 3 are each graphs, relating to different exemplary embodiments of a semiconductor layer structure, in which a refractive index n (the right ordinate) and a field amplitude A of the optical radiation field (the left ordinate) are plotted against vertical position z within the semiconductor layer structure (the abscissa). Based on the same vertical position z, the associated layer sequence is illustrated above each graph, the layers being provided with the same reference numerals as were introduced in FIG. 1. The vertical position z within the semiconductor layer structure is stated in nm, calculated against the direction of growth from the boundary surface of the p-contact layer 10 facing away from the active layer 6. The position reference can, of course, be chosen at random; for example, a side of the superlattice 9 could be used as the position reference.

Since layers of different composition have different refractive indices, the plot of refractive index n as a function of vertical position z within the semiconductor layer structure can be used to deduce the layer construction of that structure. GaN layers have a refractive index n of about 2.52. The refractive index n of AlGaN layers decreases from this value with increasing Al content. In the exemplary embodiments illustrated in FIGS. 2-3, the p-contact layer 10, the p-waveguide layer 8 and the n-waveguide layer 5 are GaN layers. The barrier layer 7 and the n-cladding layer 4 are AlGaN layers, barrier layer 7 having a high Al content and n-cladding layer 4 a moderate Al content. Mg can be used as the dopant for p-doping and Si as the dopant for n-doping.

The superlattice 9 is formed by ten each of alternately stacked GaN/AlGaN layers. Here again, the number of layers is chosen only by way of example, and for purposes of clarity has not been made too great. The superlattice 9 typically has a larger number of layers, for example several tens of to a few hundred layers of each composition. Analogously to FIG. 1, the GaN layers, as layers of a first composition a, are provided with the reference numeral $9a$, and the AlGaN layers, as layers of a second composition b, with the reference numeral $9b$. The superlattice has a GaN layer $9a$ on its side adjoining p-contact layer 10 (the left side in the diagrams), and an AlGaN layer $9b$ on its side adjoining p-waveguide layer 8 (the right side in the diagrams). The superlattice 9 functions as a p-cladding layer.

The field amplitude A of the optical radiation field generated in the active layer 6 during the operation of the semiconductor layer structure is given in arbitrary units on the left ordinate. The field amplitude A shows a bell-curve-like distribution in all the exemplary embodiments, with a maximum, normalized to 1, in the active layer 6. The decrease in field strength on both sides of the active layer 6 is determined by the distribution of the refractive index n.

In addition, the dopant concentration c, also known as the degree of doping, in the layers of the superlattice 9 is given by a bar graph superimposed on the plot. Like the field amplitude A, the degree of doping c is given in arbitrary units on the left abscissa. Unless otherwise stated in a specific case, the illustrated dopant concentration c relates to the substance used for p-doping, i.e., for example, Mg.

FIG. 2 shows three exemplary embodiments of a semiconductor layer structure. Common to these examples is the fact that within one or both layer sets, the dopant concentration c is constant for layers in one region of the superlattice 9 and decreases linearly in another region.

Figure 2A:
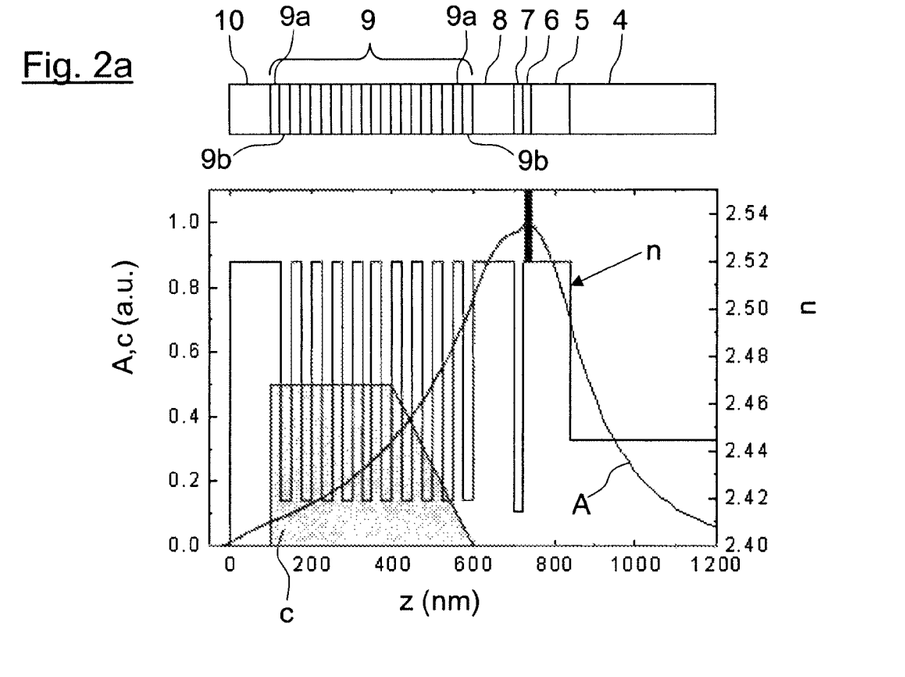

In the example of FIG. $2a$, the dopant concentration c is constant in the each of the first six of the AlGaN and GaN layers $9b$, $9a$ facing toward the p-contact layer 10 (the left side in the diagram) and is the same for both layer types. In the next four layers facing toward the active layer 6, the dopant concentration c decreases linearly to zero.

Figure 2B:
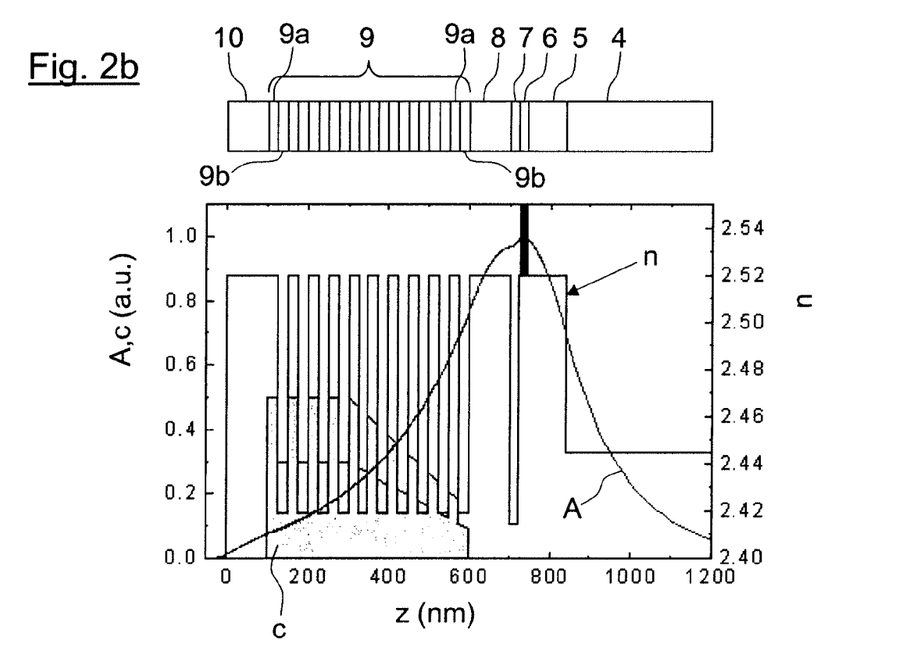

The exemplary embodiment of FIG. $2b$ shows an essentially similar doping distribution. Here, the constant region extends to four layers of each type, the degree of doping of the GaN layers $9a$ being higher than that of the AlGaN layers $9b$. In the next six layers of each type, proceeding in the direction of the active layer, the dopant concentration c decreases linearly within each layer set to a respective value that is different from zero.

Figure 2C:
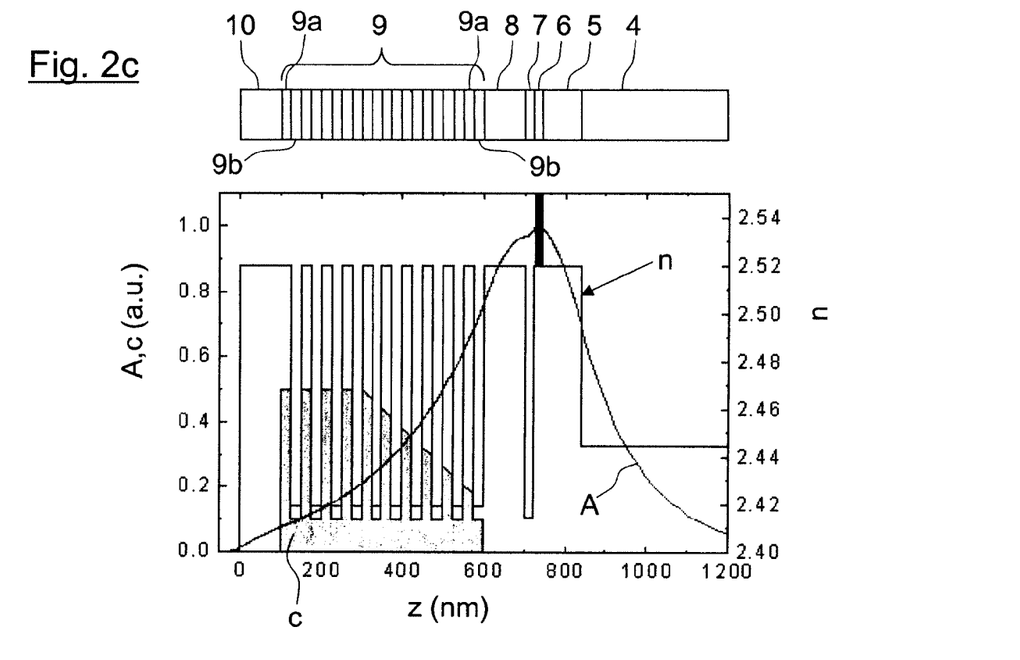

In the example of FIG. $2c$, the dopant concentration c within the superlattice 9 varies as in the example of FIG. $2b$ with regard to the GaN layers $9a$, while the degree of doping of the AlGaN layers $9b$ is constant, at a low level.

In the exemplary embodiments of FIG. 2, through the decrease that it undergoes across more than one layer in the direction of the active layer 6, the degree of doping is matched to the distribution of the field amplitude A, and thus so are the absorption coefficients of the layers.

It can be seen from the distribution of the field amplitude A that the radiation generated by the active layer 6 during operation still possesses nearly 80% of its maximum amplitude as it penetrates the superlattice. A comparison of absorption coefficients for radiation with a wavelength of 400 nm shows, for example, that Mg-doped GaN (dopant concentration $4\times10^{19}$ cm$^{-3}$) has an absorption coefficient ten times higher than that of undoped GaN (source: M. Kumerato et al., Phys. stat. sol. 2002, Vol. 192, No. 2, p. 329). Particularly in the region of high field strengths A, the use of undoped or only minimally doped layers therefore makes it possible to reduce absorption losses in the superlattice 9. To counteract a decrease in the conductivity of the superlattice 9 due to the use of undoped or only minimally doped layers, the dopant concentration c can be slightly higher in the other layers by comparison to a superlattice that is doped uniformly across all layers. Due to the superlinear decrease in field amplitude A, the slightly higher absorption losses associated with the increased degree of doping of the remaining layers amount to less than the decrease in absorption losses brought about by the undoped layers. The superlattice 9 therefore effectively (based on the sum of all layers $9a$ and $9b$) has lower absorption, with equal conduction, than the superlattice known from the prior art.

In the context of the application, an undoped layer is to be understood as a nominally (i.e., within technically measurable and controllable limits) undoped layer.

One problem with components that contain Mg-doped layers is that when the component is in operation, the dopant Mg can migrate by diffusion processes into the active zone, causing high optical absorption losses there. In the described superlattices 9, an additional advantage in this regard comes from the fact that the undoped or low-doped layers facing toward the active layer 6 represent a drop in concentration for any diffusing Mg, and thereby counteract the migration of Mg on into the active layer 6.

Alternatively, it can also be provided in all the illustrated exemplary embodiments to use layers that are n-doped with Si instead of the undoped layers. The absorption coefficient of Si-doped GaN layers falls between that of an undoped layer and that of a layer doped with Mg (assuming the same dopant concentration c as in the case of Si). The conductivity obtained may be slightly lower than in the case of undoped layers, but no conduction-impeding p-n junctions operated in the barrier direction are formed with layers of the thicknesses typically provided in the superlattice.

The use of Si-doped layers within the superlattice therefore also makes it possible to reduce optical absorption losses and simultaneously to achieve a high conductivity for the superlattice 9. In addition, Si-doped layers function as diffusion barriers for diffusing Mg and thus, in a similar fashion to undoped layers, counteract the migration of Mg into the active layer 6.

Generalized, the distribution of the dopant concentration c, also known as the doping profile, within the superlattice 9 can be described by an (envelope) function that gives the dopant concentration c of a layer as a function of the position of that layer. For this purpose, either a common function can be defined for all layer sets, as in the exemplary embodiments of FIGS. $2a$ and $3a$, for example (see below), or an individual function can be defined for each layer set, as in FIGS. $2b$, $2c$ and $3b$, for example (see below). The exemplary embodiments of FIG. 2 can be described by the superposition of a step function and a linear function. Of course, any arbitrary function curve is theoretically possible, including a nonlinear curve, for example.

Figure 3A:
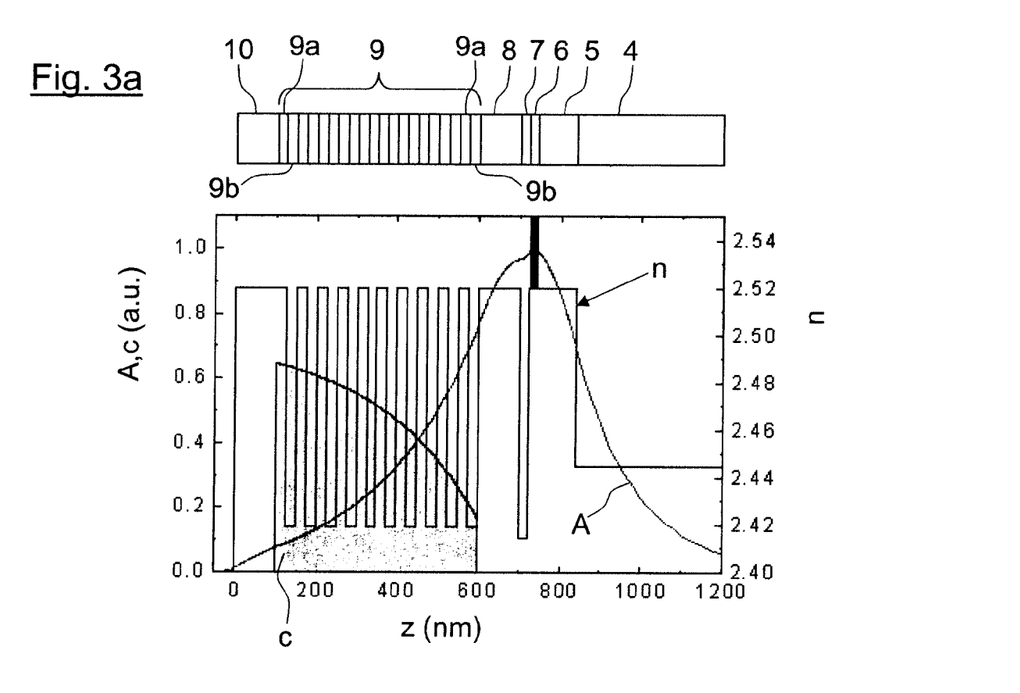

Examples of semiconductor layer structures with nonlinear doping profiles are illustrated in FIG. 3. In the example of FIG. 3a, the distribution of the dopant concentration c is the same for both layer sets (layers 9a, 9b). The distribution decreases superlinearly monotonously in the direction of active layer 6 and is matched in approximately mirror-image fashion to the distribution of the field amplitude A, such that low optical absorption prevails in regions of high field strength. Although the absorption coefficient is high in regions of low field strength, the absolute optical absorption there is low. An optimum can be reached between low overlap of the optical radiation with highly absorbing regions and good electrical conductivity.

Figure 3B:
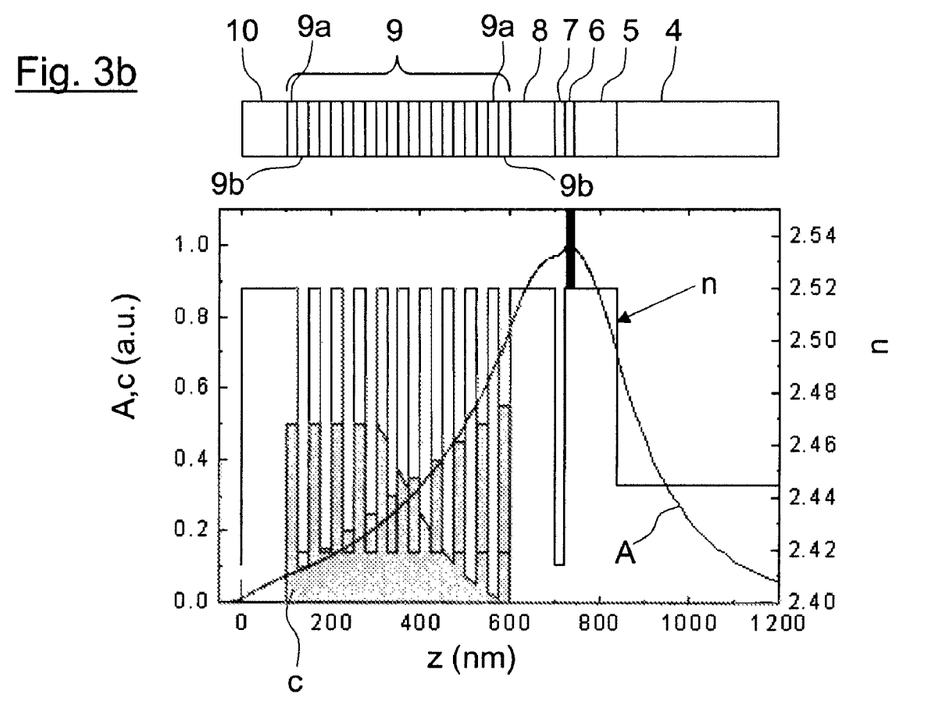

In the example of FIG. 3b, the doping profiles for the GaN and AlGaN layers 9a, 9b are different. Here again, the highly absorbing GaN layers 9a are given a distribution of dopant concentration c that decreases in the direction of the active layer 6. In the AlGaN layers 9b, which are essentially less absorbing because of their larger band gap, the distribution exhibits a reverse tendency in order to equalize the electrical conductivity. This exemplary embodiment illustrates a good compromise between low optical absorption and good electrical conductivity for cases in which the overall quantity of Mg dopant in the superlattice 9 is to be limited. Without such limitation, it is also conceivable for all the AlGaN layers 9b to be doped with a constantly high Mg concentration.

The dopant concentration c in the superlattice 9 can be graded within a layer. Examples where the degree of doping within a non-constant doping profile also is not constant within a layer are provided in FIGS. 2, 3a and 3b (here only GaN layers 9a). In this case, the dopant concentration c follows the variation of the (envelope) function within a layer. In the case of the AlGaN layers 9b illustrated in FIG. 3b, however, the degree of doping varies within the layer sets but is constant for each individual layer. In such a case, the value of the (envelope) function at a given position within each layer, e.g. at the center of each layer, defines the dopant concentration c for the entire layer. A graded degree of doping within a layer can boost the conduction-enhancing effect of a superlattice.

The actual distribution of the dopant concentration c within a layer set and also within a layer of the superlattice 9 may deviate, e.g. as a result of diffusion processes, from the nominal concentration distribution aimed at during the manufacturing process. In practice, this deviation may take the form, for example, of a "softening" or "smearing" of steps or regions with high concentration gradients, but this has no effect on the basic properties of the inventive superlattice 9 and does not lessen its advantages over known, uniformly doped superlattices.

The description of the invention with reference to the described exemplary embodiments is not to be understood as restricting the invention thereto. Rather, the invention also encompasses combination with all other features recited in the exemplary embodiments and the rest of the description, even if such combination is not the subject matter of a claim.

The invention claimed is:

1. A semiconductor layer structure, comprising a superlattice composed of alternately stacked layers of III-V compound semiconductors of a first composition and at least one second composition, wherein said layers contain dopants in predetermined concentrations, said concentrations of said dopants are different in at least two layers of a same composition in said superlattice, said concentration of said dopants is graded within at least one said layer of said superlattice, said superlattice comprises layers that are doped with different dopants and said superlattice comprises at least one layer that is undoped.

2. A semiconductor layer structure, comprising a superlattice composed of alternately stacked layers of III-V compound semiconductors of a first composition and at least one second composition, wherein said layers contain dopants in predetermined concentrations, said concentrations of said dopants are different in at least two layers of a same composition in said superlattice, and said concentration of said dopants is graded within at least one said layer of said superlattice, and wherein said superlattice comprises at least one layer that is undoped.

3. The semiconductor layer structure as in claim 1, wherein said superlattice comprises alternately stacked $In_xAl_yGa_{1-x-y}N$ and $In_wAl_zGa_{1-w-z}N$ layers, where $0 \leq x,y,w,z \leq 1$ and $x+y \leq 1$ and $w+z \leq 1$.

4. The semiconductor layer structure as in claim 1, wherein said superlattice comprises alternately stacked $In_xAl_yGa_{1-x-y}P$ and $In_wAl_zGa_{1-w-z}P$ layers, where $0 \leq x,y,w,z \leq 1$ or alternately stacked $In_xAl_yGa_{1-x-y}As$ and $In_wAl_zGa_{1-w-z}As$ layers, where $0 \leq x,y,w,z \leq 1$ and $x+y \leq 1$ and $w+z \leq 1$.

5. The semiconductor layer structure as in claim 1, wherein individual layers of said superlattice are assigned a vertical position z within said semiconductor layer structure and the concentration of dopants in a said layer changes at least in part in a predetermined manner depending on the vertical position z of that layer within said semiconductor layer structure.

6. The semiconductor layer structure as in claim 5, wherein the dependence of said concentration of said dopants on said vertical position z is defined by a common function for all said layers of said superlattice.

7. The semiconductor layer structure as in claim 5, wherein the dependence of said concentration of said dopants on said vertical position z is defined by a first function for said layers of said first composition and by at least one second function for said layers of said at least one second composition.

8. The semiconductor layer structure as in claim 6, wherein said common function is a step function or a monotonously rising/falling function or a linear function or a polynomial function or a root function or an exponential function or a logarithmic function or a periodic function or a superposition of said functions or contains fractions of one of said functions.

9. The semiconductor layer structure as in claim 1, wherein said concentration of said dopants is constant within at least one said layer of said superlattice.

10. The semiconductor layer structure as in claim 1, wherein said dopants are Mg and/or Si.

11. An optoelectronic component comprising a semiconductor layer structure as in claim 1.

12. The optoelectronic component as in claim 11, which comprises an optically active layer and wherein said concentration of said dopants in layers of at least one of said compositions increases within said superlattice of said semiconductor layer structure with increasing distance from said optically active layer.

13. The optoelectronic component as in claim 12, which is a light-emitting diode.

14. The optoelectronic component as in claim 12, which is a laser diode.

15. The semiconductor layer structure as in claim 7, wherein said first and/or said at least one second function is a step function or a monotonously rising/falling function or a linear function or a polynomial function or a root function or an exponential function or a logarithmic function or a periodic function or a superposition of said functions or contains fractions of one of said functions.

16. The semiconductor layer structure as in claim 2, wherein individual layers of said superlattice are assigned a vertical position z within said semiconductor layer structure and the concentration of dopants in a said layer depends in a predetermined manner on the vertical position z of that layer within said semiconductor layer structure.

17. An optoelectronic component comprising a semiconductor layer structure as in claim 2.

18. The optoelectronic component as in claim 17, which comprises an optically active layer and wherein said concentration of said dopants in layers of at least one of said compositions increases within said superlattice of said semiconductor layer structure with increasing distance from said optically active layer.

19. The optoelectronic component as in claim 18, wherein the optoelectronic component is a light-emitting diode or a laser diode.

\* \* \* \* \*

UNITED STATES PATENT AND TRADEMARK OFFICE
CERTIFICATE OF CORRECTION

| | | |
|---|---|---|
| PATENT NO. | : 7,822,089 B2 | |
| APPLICATION NO. | : 11/780512 | |
| DATED | : October 26, 2010 | |
| INVENTOR(S) | : Christoph Eichler and Alfred Lell | |

It is certified that error appears in the above-identified patent and that said Letters Patent is hereby corrected as shown below:

Title Page, item (73) ASSIGNEE, please delete "Osram" and insert -- OSRAM --.

Title Page, item (57) ABSTRACT, please replace the abstract with the following abstract -- A semiconductor layer structure comprises a superlattice composed of alternately stacked layers of III-V semiconductor compounds of a first composition and at least one second composition. The layers of the superlattice contain dopants in predetermined concentrations, with regard to which the concentrations of the dopants are different at least two layers of a same composition in the superlattice, the concentration of the dopants is graded within at least one layer of the superlattice, and the superlattice comprises layers that are doped with different dopants or comprise at least one layer that is undoped. --

Page 2, OTHER PUBLICATIONS, please delete "K.A. Mikhoyan" and insert -- K.A. Mkhoyan --.

Page 2, OTHER PUBLICATIONS, S. Nakamura et al., please delete "InaN/GaN" and insert -- InGaN/GaN --.

Page 2, OTHER PUBLICATIONS, Ting Gang Zhu et al., please replace the current title with the following -- AlGaN-GaN UV Light-Emitting Diodes Grown on SiC by metal-Organic Chemical Vapor Deposition --.

Column 1, please insert the following sub heading after the title -- CROSS REFERENCE TO RELATED APPLICATIONS --.

Signed and Sealed this
Fifteenth Day of March, 2011

David J. Kappos
*Director of the United States Patent and Trademark Office*

CERTIFICATE OF CORRECTION (continued)
U.S. Pat. No. 7,822,089 B2

Column 1, lines 4-7, please delete the paragraph beginning with the wording "This patent application ..." and insert the following paragraph -- This application claims the benefit of foreign priority applications filed in Germany, serial number 10 2006 034 821.4, filed July 27, 2006, and serial number 10 2006 046 227.0, filed September 29, 2006. The contents of the prior applications are hereby incorporated by reference in their entirety.

Column 1, line 8, please insert the sub heading -- FIELD OF THE INVENTION -- prior to the paragraph beginning with the wording "The invention relates to . . .".

Column 1, line 14, please insert the sub heading -- BACKGROUND -- prior to the paragraph beginning with the wording "Superlattices containing alternately . . .".

Column 1, line 25, please insert the sub heading -- SUMMARY -- prior to the paragraph beginning with the wording "It is an object of the invention . . .".

Column 1, line 30, delete "This object is achieved, in accordance with Claim 1," and insert -- Some embodiments disclosed herein achieve this object --.

Column 1, line 39, delete "This object is further achieved, in accordance with Claim 3," and insert -- Additional embodiments disclosed herein achieve this object --.

Column 3, line 24, please insert the sub heading -- BRIEF DESCRIPTION OF THE DRAWINGS -- prior to the paragraph beginning with the wording "Therein:".

Column 3, line 33, please insert the sub heading -- DETAILED DESCRIPTION -- prior to the paragraph beginning with the wording "Figure 1 provides a schematic . . .".

In Claim 4, column 10, line 21, please delete "1 or" and insert -- 1, or --.